(12) United States Patent
Hain et al.

(10) Patent No.: US 6,693,528 B1
(45) Date of Patent: Feb. 17, 2004

(54) SWITCHGEAR CABINET MONITORING ARRANGEMENT

(75) Inventors: Markus Hain, Dillenburg (DE); Michael Seelbach, Freudenberg (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 09/523,601

(22) Filed: Mar. 13, 2000

(30) Foreign Application Priority Data

Mar. 13, 1999 (DE) .......................................... 199 11 250

(51) Int. Cl.$^7$ ................................................ G08B 29/00
(52) U.S. Cl. ..................... 340/506; 340/511; 340/517; 340/3.1; 340/310.01; 340/310.06
(58) Field of Search ................................. 340/506, 511, 340/517, 3.1, 310.01, 310.06

(56) References Cited

U.S. PATENT DOCUMENTS 5,400,246 A * 3/1995 Wilson et al. ........... 340/3.1 X

FOREIGN PATENT DOCUMENTS

DE 196 09 689 9/1997

* cited by examiner

*Primary Examiner*—Daryl Pope
(74) *Attorney, Agent, or Firm*—Pauley Petersen & Erickson

(57) ABSTRACT

A switchgear cabinet monitoring arrangement having a monitoring unit with several inputs for connecting sensors, as well as several outputs connected with the inputs via a linkage device for the connection of actuators, and having a programming unit. An adaptation to various uses is available because the linkage device is designed with connections between the inputs and the outputs, which can be preset and changed by means of the program unit.

13 Claims, 3 Drawing Sheets

for connecting actuators 3.

SWITCHGEAR CABINET MONITORING ARRANGEMENT

BACKGROUND OF THE INVENTION

1. Field of the Invention

This invention relates to a switchgear cabinet monitoring arrangement having a monitoring unit with several inputs for connecting sensors, as well as several outputs connected with the inputs via a linkage device for the connection of actuators, and having a programming unit.

2. Description of Prior Art

Such a switchgear cabinet monitoring arrangement is known from German Patent Reference DE 196 09 689 A1. In this known switchgear cabinet monitoring arrangement, inputs of a monitoring unit for several different sensors are connected via a linkage device with outputs, by which the actuators are connected to the monitoring unit 1.1. When responding to the sensor signals, the values determining the sensor signals can be controlled or regulated by the actuators. For example, in case of a temperature increase, appropriate climate-controlling components of the switchgear cabinet are triggered. A computer for reading out measured values, or for reprogramming threshold values, can also be connected to the monitoring unit.

SUMMARY OF THE INVENTION

One object of this invention is to provide a switchgear cabinet monitoring arrangement where an adjustment to different switchgear cabinet functions is simplified, and a more flexible adaptation to different uses, as well as easier refitting, are made possible.

This object is achieved with a switchgear cabinet monitoring arrangement as set forth in this specification and in the claims. A linkage device is designed with connections between the inputs and the outputs, which can be preset and changed by a programming unit. The inputs and outputs can be differently occupied by the linkage device and the programming unit designed in this way, and can be arbitrarily connected with each other in a simple way depending upon the respective requirements. With the programming unit and the linkage device a user can realize many switchgear cabinet functions.

The variety of adaptations is increased with several inputs that can be selectively connected with one output, or one input with several outputs.

If the linkage device has different linkage members, which can be selectively installed into the connection between the inputs and the outputs by the programming unit, it is possible to affect the type of processing, wherein the linkage members can be arbitrarily employed as components.

Expanded linkage options are achieved because with the programming unit it is possible to selectively install different intermediate input, or respectively output, members between the inputs and the linkage members and/or between the linkage members and the outputs.

The measures, that the inputs, the linkage device, and the outputs, can be differently displayed in the linked state and the not linked state in the form of diagrams on a monitor of the programming unit, aid in the simple making and changing of the connections between the inputs and the outputs. Varied suitable linkage options are achieved because the linkage members are selected, inter alia, from the groups of AND, OR, NAND, NOR members, timer, hysteresis member and flip-flop.

A simple connecting possibility and operating possibility from a remote location results because the programming unit is or can be connected with the monitoring unit via a bus, or a network.

The function of the switchgear cabinet monitoring arrangement is further expanded with representations on a monitoring display device connected to the monitoring device that can be preset and changed by means of the programming unit.

BRIEF DESCRIPTION OF THE DRAWINGS

This invention will be explained in greater detail by exemplary embodiments, making reference to the drawings wherein.

DESCRIPTION OF PREFERRED EMBODIMENTS

Figure 1:
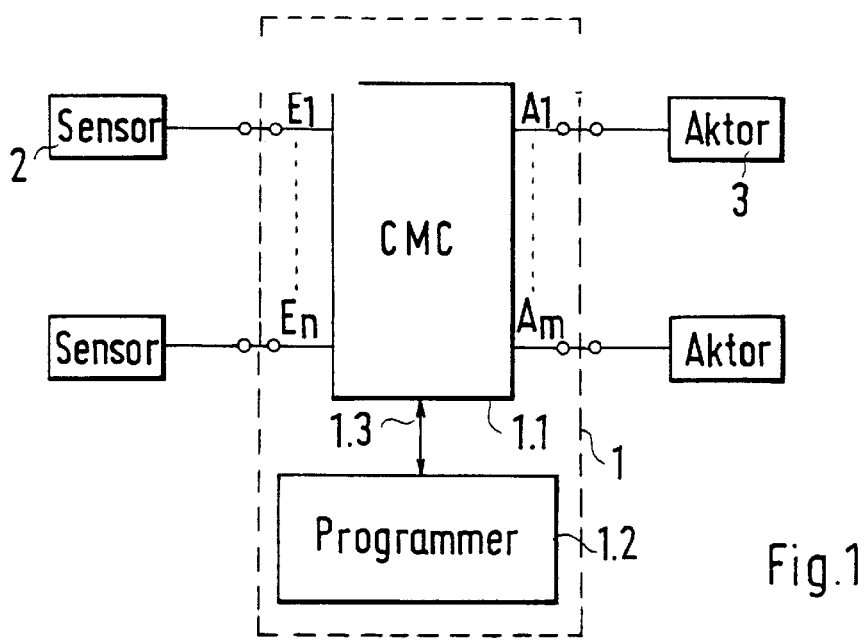
FIG. 1 represents a block diagram with essential components of a switchgear cabinet monitoring arrangement, according to one preferred embodiment of this invention.

FIG. 1 represents a switchgear cabinet monitoring arrangement 1 with a monitoring unit 1.1 and a programming unit 1.2 connected by means of a connecting line 1.3. The monitoring unit 1.1 has inputs $E_1 \ldots E_n$ for connecting sensors 2, and outputs $A_1 \ldots A_m$ for connecting actuators 3.

Figure 2:
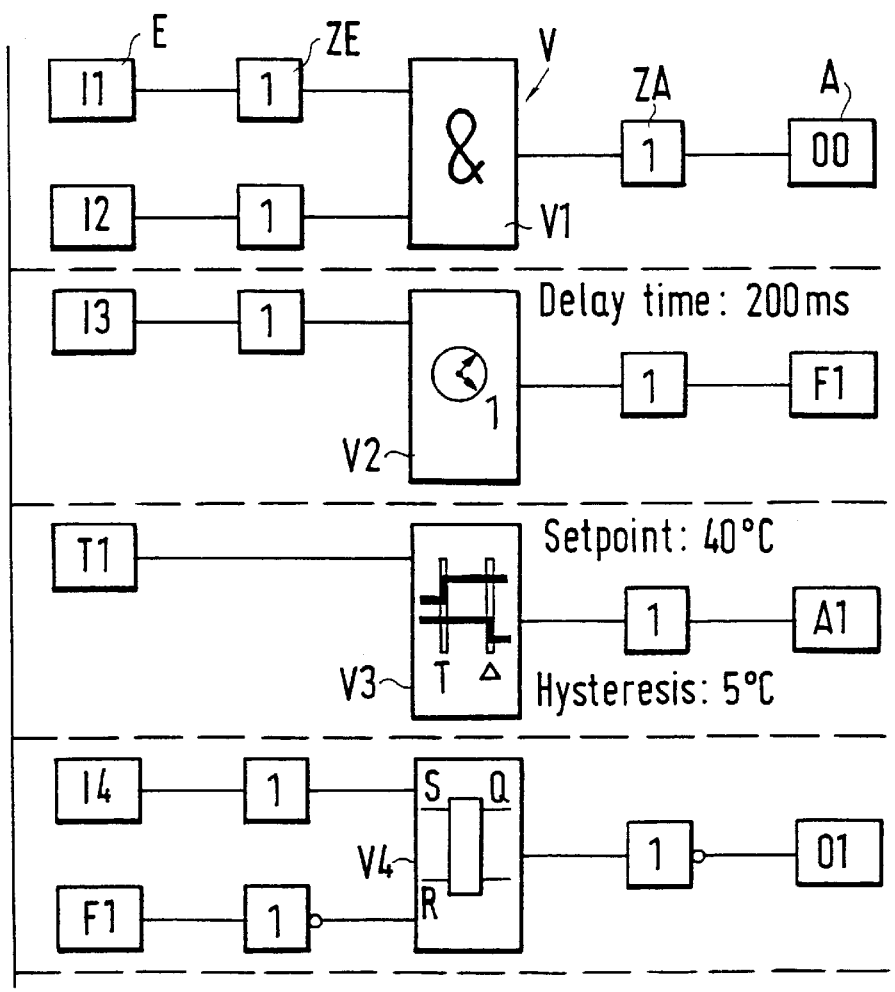
FIG. 2 represents a block diagram of linkage possibilities between inputs and outputs of a monitoring unit of the switchgear cabinet monitoring arrangement.
Figure 3:
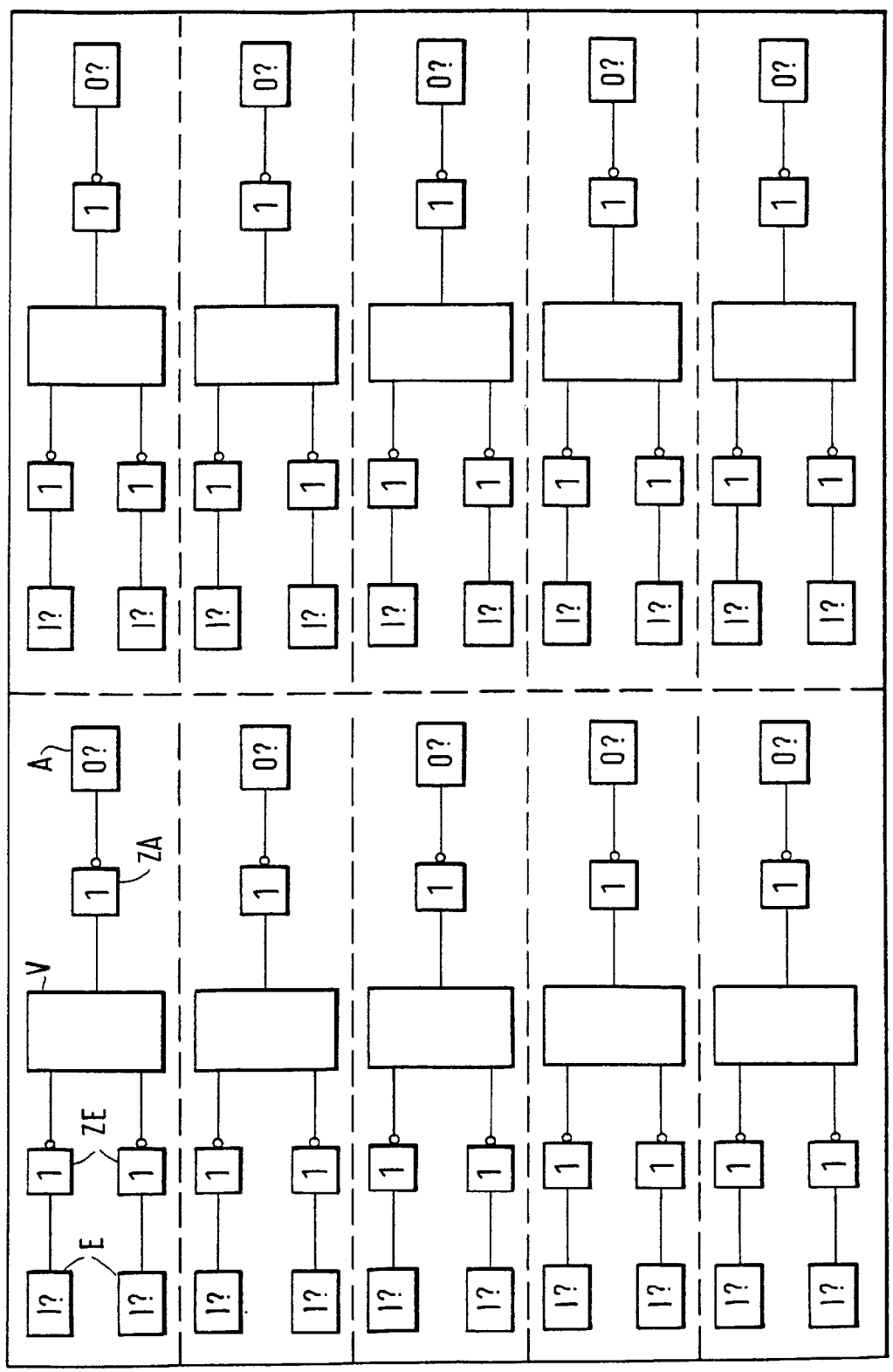
FIG. 3 represents linkage possibilities between inputs and outputs of a monitoring unit in an unoccupied state of the linkage device.
Figure 4:
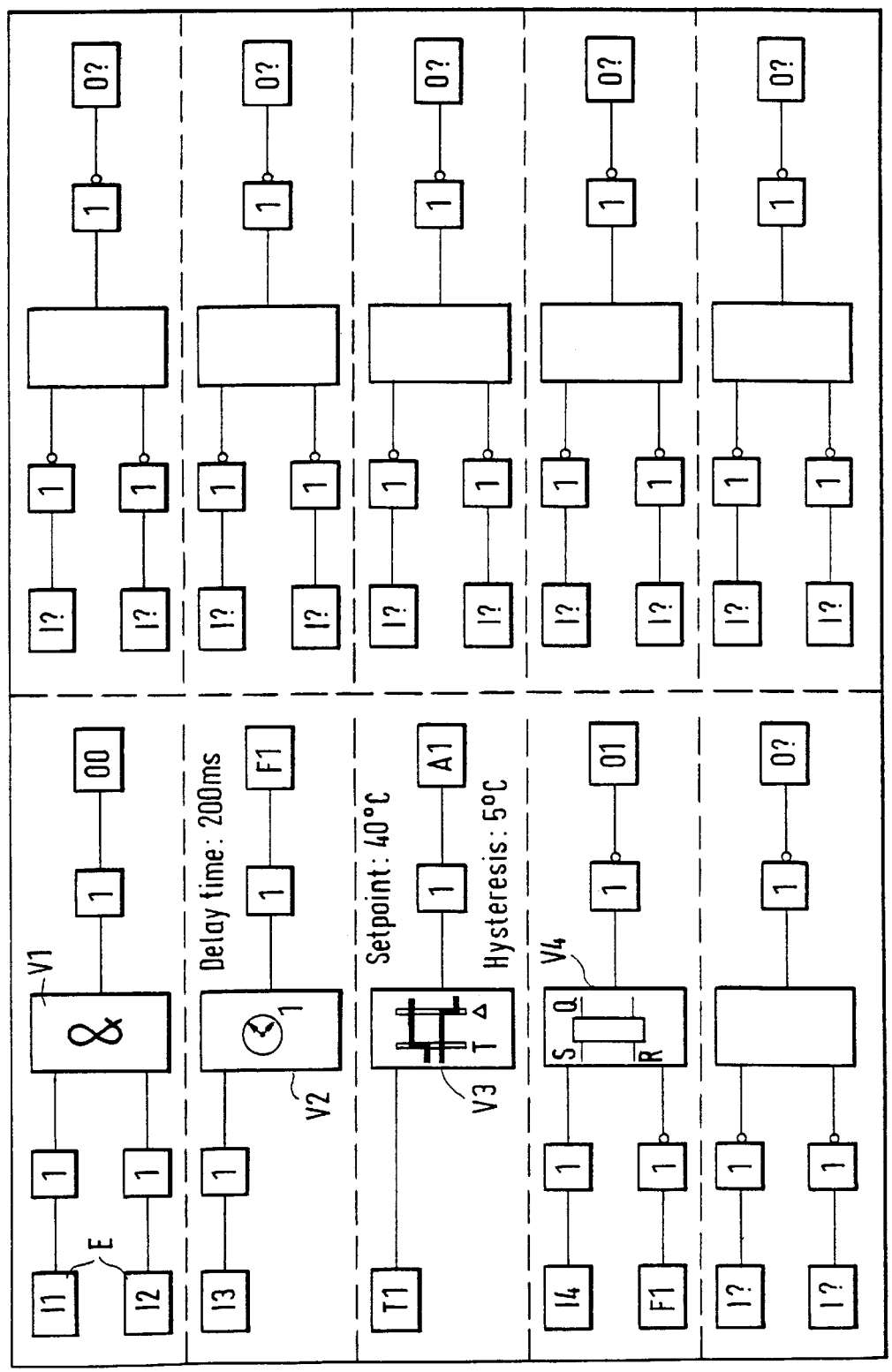
FIG. 4 is a representation in accordance with FIG. 3, with some linkages between inputs and outputs.
Figure 2:
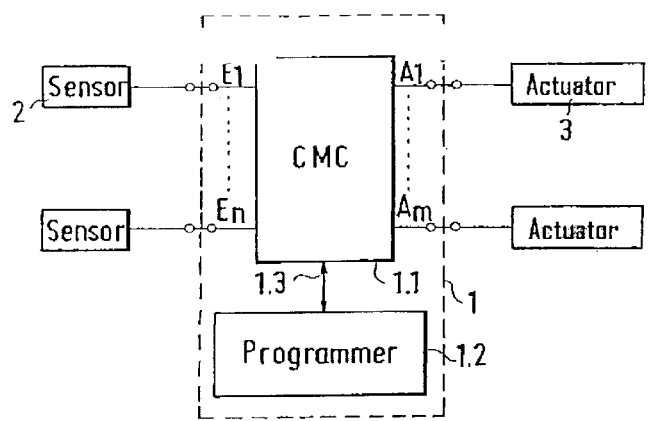
Figure 2:
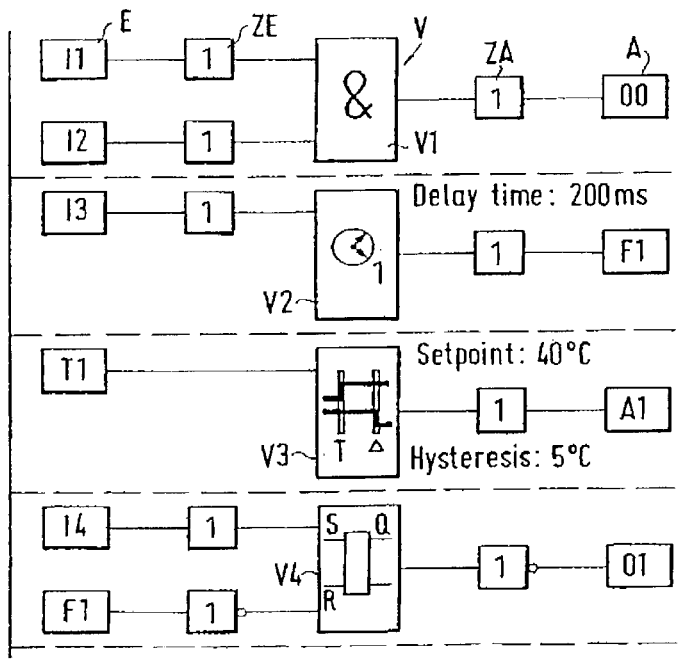

As FIGS. 2 to 4 show, the inputs E can be variably connected by means of the programming unit 1.2 in different ways with the outputs A via intermediate input members ZE, linkage members V and intermediate output members ZA. For this, the inputs E, the intermediate input members ZE, the linkage members V and the intermediate output members ZA are represented in blocks, which can be connected with each other, in the programming unit 1.2. In accordance with FIG. 2, two inputs E, in whose blocks E1, E2 are entered, are linked with each other via respective non-inverting intermediate input members ZE by means of an AND member V1, and are connected via a non-inverting intermediate output member ZA with an output A of the identification OO. One input E with the entry I3 is connected via a non-inverting intermediate input member ZE, a delay member in the form of a timer V2, and via a non-inverting intermediate output member ZA, with a further output A with the identification F1. An input E with the identification T1 is connected via a hysteresis member V3 and an intermediate output member ZA with a further output A with the identification A1, while two further inputs E with the identification I4, F1 are conducted via a non-inverting intermediate input member ZE and an inverting intermediate input member ZE to the inputs of a linkage member V in the form of a flip-flop V4, and from there via an inverting intermediate output member ZA to a further output A with the identification O1. Linkages of one or two freely selectable inputs with one or two freely selectable outputs are preferably connected via also freely selectable linkage members V, which are provided as components. However, it is possible to also connect more inputs E with one output A, or vice versa.

In a block diagram in accordance with FIG. 3, all inputs E, intermediate input members ZE, linkage members V, intermediate output members ZA and outputs A are still unoccupied, so that it is possible to assign appropriate occupations to them. The entire diagram representation is divided into ten individual blocks, wherein it is possible to assign one or two arbitrary inputs E to any arbitrary output A via desired linkage members V. In contrast to FIG. 3, in FIG. 4 an assignment in accordance with FIG. 2 has already been made for the first four blocks, while the remaining six blocks are still available for arbitrary occupation.

In the programming unit 1.2 only suitable inputs E can be linked with suitable outputs A, and unsuitable linkage members V, intermediate input members ZE and intermediate output members ZA are avoided in the linkage. For example, it is not possible for a digital input to be connected with an analog output, except if the input signal is conducted through a digital/analog converter in the monitoring unit 1.1. The program correspondingly checks that in regard to voltage and current suitable inputs are only connected with suitable outputs.

In order to design the switchgear cabinet monitoring arrangement 1 for a user in a clearly laid-out manner with respect to signaling and display, the possibility of varying the displayed symbols, or respectively texts, is also provided in the programming unit 1.2, and the monitoring unit 1.1 is laid out to correspond to these display and signaling possibilities, the same as the display unit to be controlled.

A parametric data set produced by means of the programming unit 1.2 is transmitted to the monitoring unit 1.1 by means of a data set transmission, for example via a serial interface or a network (connecting line 1.3), using a TFTP (Trivial File Transfer Protocol). These parametric data sets, or respectively configuration data sets, can also be transferred in the opposite direction from the monitoring unit 1.1 to the programming unit 1.2, for example a personal computer, to check the configuration and to make changes, if desired.

Logical linkage members, such as AND members V1, OR members, as well as their negations, are possible as linkage members. Furthermore, timers V2, hysteresis members V3, as well as different flip-flops V4 (for example RS or D flip-flops) are provided. Threshold switches are also provided as linkage members V. Input signals can be digital input signals, temperature input signals, door release signals, outputs, and/or markers. Digital output signals, markers with alarm reports and markers without alarm reports can be output signals. The input and output signals can be additionally inverted. Besides standard settings, such as alarm LED on/off, safety LED on/off, etc., the configuration contains the possibility of activating or deactivating up to four alarm recipients, whose addresses are filed in the monitoring unit 1.1. Additionally, up to ten alarm reports (reports for the marker with an alarm) can be set.

The configuration of the temperature inputs contains a text description for each appropriate input, as well as minimum and maximum limit values.

Compilation can take place once the configurations, or respectively assignments, are made. Data sets are generated in the course of this, which can be transmitted to the monitoring unit 1.1.

Multitudinous variation options for the switchgear cabinet monitoring arrangement are made possible in a simple manner by means of the described steps.

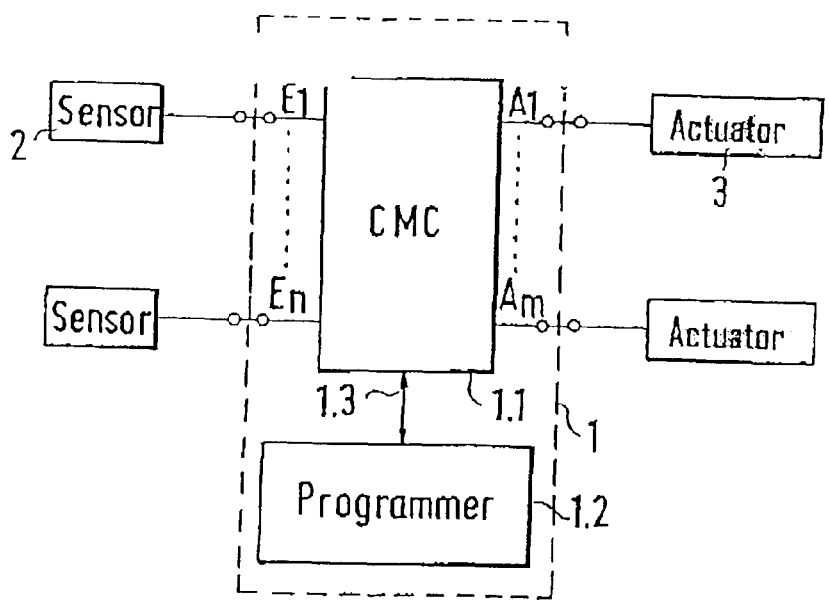

What is claimed is:

1. A switchgear cabinet monitoring arrangement comprising:
   a self-contained monitoring unit (1.1) positioned within a stand-alone switchgear cabinet, the self-contained monitoring unit comprising a plurality of inputs (E, $E_1 \ldots E_n$) for connecting sensors (2), and a plurality of outputs (A, $A_1 \ldots A_m$) connected with the inputs (E, $E_1 \ldots E_n$) via a linkage device (AE, V, ZA) for connection of actuators (3); and
   a programming unit (1.2) operatively connected to the self-contained monitoring unit (1.1),
   wherein the linkage device (AE,V,ZA) having a plurality of connections between the inputs (E, $E_1 \ldots E_n$) and the outputs (A, $A_1 \ldots A_m$) which can be preset and changed by the programming unit (1.2).

2. In the switchgear cabinet monitoring arrangement in accordance with claim 1, wherein the inputs (E, $E_1 \ldots E_n$) can be selectively connected with one of one of the outputs (A, $A_1 \ldots A_m$), one of the inputs (E, $E_1 \ldots E_n$) and the outputs (A, $A_1 \ldots A_m$).

3. In the switchgear cabinet monitoring arrangement in accordance with claim 2, wherein the linkage device (ZE, V, ZA) has different linkage members (V1 to V4) which can be selectively installed by the programming unit (1.2) into a connection between the inputs (E, $E_1 \ldots E_n$) and the outputs (A, $A_1 \ldots A_m$).

4. In the switchgear cabinet monitoring arrangement in accordance with claim 1, wherein the programming unit (1.2) can selectively install one of a different intermediate input (ZE) and output members (ZA) at least one of between the inputs (E, $E_1 \ldots E_n$) and the linkage members (ZE, V, ZA) and between the linkage members (ZE, V, ZA) and the outputs (A, $A_1 \ldots A_m$).

5. In the switchgear cabinet monitoring arrangement in accordance with claim 4, wherein the inputs (E, $E_1 \ldots E_n$), the linkage device (ZE, V, ZA), and the outputs (A, $A_1 \ldots A_m$) can be differently displayed in a linked state and a not linked state in a form of diagrams on a monitor of the programming unit (1.2).

6. In the switchgear cabinet monitoring arrangement in accordance with claim 5, wherein the linkage members are selected from a group of AND, OR, NAND, NOR members (V1), a timer (V2), a hysteresis member (V3) and a flip-flop (V4).

7. In the switchgear cabinet monitoring arrangement in accordance with claim 6, wherein the programming unit (1.2) is connected with the monitoring unit (1.1) by one of a bus and a network.

8. In the switchgear cabinet monitoring arrangement in accordance with claim 7, wherein representations on a monitoring display device connected to the monitoring device (1.1) can be preset and changed by the programming unit (1.2).

9. In the switchgear cabinet monitoring arrangement in accordance with claim 1, wherein the linkage device (ZE, V, ZA) has different linkage members (V1 to V4) which can be selectively installed by the programming unit (1.2) into a connection between the inputs (E, $E_1 \ldots E_n$) and the outputs (A, $A_1 \ldots A_m$).

10. In the switchgear cabinet monitoring arrangement in accordance with claim 1, wherein the inputs (E, $E_1 \ldots E_n$), the linkage device (ZE, V, ZA), and the outputs (A, $A_1 \ldots A_m$) can be differently displayed in a linked state and a not linked state in a form of diagrams on a monitor of the programming unit (1.2).

11. In the switchgear cabinet monitoring arrangement in accordance with claim 3, wherein the linkage members are selected from a group of AND, OR, NAND, NOR members (V1), a timer (V2), a hysteresis member (V3) and a flip-flop (V4).

12. In the switchgear cabinet monitoring arrangement in accordance with claim 1, wherein the programming unit (1.2) is connected with the monitoring unit (1.1) by one of a bus and a network.

13. In the switchgear cabinet monitoring arrangement in accordance with claim 1, wherein representations on a monitoring display device connected to the monitoring device (1.1) can be preset and changed by the programming unit (1.2).

* * * * *

UNITED STATES PATENT AND TRADEMARK OFFICE
CERTIFICATE OF CORRECTION

PATENT NO. : 6,693,528 B1
DATED : February 17, 2004
INVENTOR(S) : Markus Hain et al.

It is certified that error appears in the above-identified patent and that said Letters Patent is hereby corrected as shown below:

The title page should be deleted and substitute therefore the attached title page as shown on the attached page.

Drawings,
Delete drawing sheet 1, and substitute therefore the Drawing Sheets, consisting of Figs. 1-2 as shown on the attached page.

Signed and Sealed this

Twelfth Day of October, 2004

JON W. DUDAS
*Director of the United States Patent and Trademark Office*

(12) United States Patent
Hain et al.

(10) Patent No.: US 6,693,528 B1
(45) Date of Patent: Feb. 17, 2004

(54) SWITCHGEAR CABINET MONITORING ARRANGEMENT

(75) Inventors: Markus Hain, Dillenburg (DE); Michael Seelbach, Freudenberg (DE)

(73) Assignee: Rittal GmbH & Co. KG, Herborn (DE)

(*) Notice: Subject to any disclaimer, the term of this patent is extended or adjusted under 35 U.S.C. 154(b) by 0 days.

(21) Appl. No.: 09/523,601

(22) Filed: Mar. 13, 2000

(30) Foreign Application Priority Data

Mar. 13, 1999 (DE) .......................................... 199 11 250

(51) Int. Cl.$^7$ .............................................. G08B 29/00
(52) U.S. Cl. ..................... 340/506; 340/511; 340/517; 340/3.1; 340/310.01; 340/310.06
(58) Field of Search ................................ 340/506, 511, 340/517, 3.1, 310.01, 310.06

(56) References Cited

U.S. PATENT DOCUMENTS 5,400,246 A * 3/1995 Wilson et al. ........... 340/3.1 X

FOREIGN PATENT DOCUMENTS

DE 196 09 689 9/1997

* cited by examiner

Primary Examiner—Daryl Pope
(74) Attorney, Agent, or Firm—Pauley Petersen & Erickson

(57) ABSTRACT

A switchgear cabinet monitoring arrangement having a monitoring unit with several inputs for connecting sensors, as well as several outputs connected with the inputs via a linkage device for the connection of actuators, and having a programming unit. An adaptation to various uses is available because the linkage device is designed with connections between the inputs and the outputs, which can be preset and changed by means of the program unit.

13 Claims, 3 Drawing Sheets